United States Patent [19]

Linde et al.

[11] Patent Number: 5,790,057
[45] Date of Patent: Aug. 4, 1998

[54] METHOD OF AND SYSTEM FOR THE EFFICIENT ENCODING OF DATA

[75] Inventors: Yoseph L. Linde, Needham; Jeffrey F. Tabor, Brookline, both of Mass.

[73] Assignee: LANart Corporation, Needham, Mass.

[21] Appl. No.: 695,885

[22] Filed: Aug. 12, 1996

[51] Int. Cl.$^6$ ............................................. H03M 5/16
[52] U.S. Cl. ................................................ 341/68
[58] Field of Search ............................ 341/68, 51, 59, 341/57, 70, 71, 87

[56] References Cited

U.S. PATENT DOCUMENTS

| | | | |
|---|---|---|---|
| 4,573,034 | 2/1986 | Schouhamer Immink | 340/347 |
| 4,864,303 | 9/1989 | Otek | 341/95 |
| 4,971,407 | 11/1990 | Hoffman | 341/87 |
| 5,016,258 | 5/1991 | Tanaka et al. | 375/25 |
| 5,049,881 | 9/1991 | Gibson et al. | 341/95 |
| 5,241,309 | 8/1993 | Cideciyan et al. | 341/59 |
| 5,442,350 | 8/1995 | Iyer et al. | 341/51 |
| 5,446,765 | 8/1995 | Leger | 375/359 |
| 5,511,080 | 4/1996 | Itoi et al. | 371/43 |

*Primary Examiner*—Brian K. Young
*Attorney, Agent, or Firm*—Lappin & Kusmer LLP

[57] ABSTRACT

The invention relates to the efficient coding of packetized binary (NRZ) data, for example Ethernet packets, over a binary channel. Since Ethernet packetized data has three states (0, 1, and Idle), the theoretical bandwidth required for transmission, assuming completely random packets of arbitrary length and arbitrary interpacket idle periods, i.e. gaps, is 1.585 the data rate. The invention uses the information that both packets and gaps have predetermined minimum lengths constructs more efficient codes. In particular, a coding scheme is shown that provides in two states signal requiring a bandwidth of only 1.25 the three state signal data rate.

24 Claims, 3 Drawing Sheets

METHOD OF AND SYSTEM FOR THE EFFICIENT ENCODING OF DATA

BACKGROUND OF THE INVENTION

This invention relates to data encoding and conversion systems and, more particularly, to a system which provides for the encoding of packetized data to more efficiently use the data communication capacity of network media.

One of the most common Local Area Network (LAN) standards is IEEE 802.3, commonly referred to as Ethernet. This standard defines a network that is optimized for a moderately sized geographic area (such as an office, a building, or a small campus). It defines the physical media (coaxial, twisted-pair, or fiber-optic cable) as well as the protocol (carrier sense multiple access with collision detection or CSMA/CD) for the transmission of data and it utilizes baseband signalling and Manchester encoding to transit data at a maximum rate of 10 Megabits per second (Mbps). The Ethernet specification also limits the maximum diameter of a network (approximately 4 km) and the number of nodes or user workstations per network (1024). Typically, hubs, bridges, and routers are used to extend and interconnect networks to accommodate larger areas and more nodes.

Computer networks allow many users to share and thus more efficiently utilize expensive network resources such as printers and servers (a computer where data bases and programs are stored). In a modern computer environment, each desktop workstation relies heavily on the network to which it is connected. Each user workstation generates significant network activity sending documents to the printers and transmitting data and files to and from the servers. As a result, to avoid slow, unresponsive network performance of an Ethernet network having 300 or more users, modern Ethernet networks have far less than the maximum allowable 1024 users. Typically, fewer than 50–100 users will share the 10 Mbps bandwidth of a single Ethernet network, and the number of users per network is shrinking fast.

A typical Ethernet hub can connect 100–200 users. Since the number of users supported is greater than the desirable number of users per network, manufacturers have begun to sell hubs that support more than one Ethernet network. Hubs are available today that contain 4 or 8 internal Ethernet networks, permitting data communication bandwidth of 40 and 80 Mbps. Typically these hubs are interconnected using conventional media such as twisted-pair or fiber-optic cable.

The standard encoding of Ethernet data for transmission over a binary channel such as twisted-pair or fiber-optic cable is inefficient. The standard Ethernet format is a code commonly referred to as a Manchester Code. In this code each symbol of data is represented by two complementary successive bits (10 or 01). Idle periods (the periods between packets) and end of packet are represented by code violations (00 or 11).

Manchester coding can be used as a way to transmit information over a binary channel but it is very inefficient since it requires double the bit rate. For example, a channel with a capacity of 20 Mbps is required to carry 10 Mbps of Ethernet data. In the case of multiplexing, a channel with at least 160 Mbps throughput will be required to carry 8 independent Ethernets.

Accordingly, it is an object of this invention to provide a method for converting Manchester encoded three state data symbols to two state or binary data symbols.

It is another object of the invention to provide a method for converting Ethernet data to a binary format for transmission over a binary network medium, such as optical fiber.

Another object of the invention is to provide a system which can efficiently convert three state data symbols to two state or binary data symbols.

Yet another object of the present invention is to provide a system which can efficiently multiplex several Ethernet data streams over a single high speed binary link.

SUMMARY OF THE INVENTION

The invention is directed to a method of and system for converting an input data stream comprising symbols having a plurality of possible states into an output stream having fewer possible states. This is accomplished by separating the input data stream into input blocks of N symbols and encoding each block into an output block of K symbols where K is greater than N. The possible input symbols are: 0, 1 and Idle, the possible output symbols are 0 and 1 only. It is possible to view the input stream as being in one of two states; the Idle state where there is no transmission of information and the active (or packet) state when binary information is transmitted. In accordance with the invention, the output block is encoded by an encoder with information representative of the state of the input stream in order to permit a decoder to determine the boundary of packets and to distinguish between a block of Idle symbols and a block of Data Symbols (or a transition from one to the other).

The invention is embodied in a system for connecting two or more remotely located networks or network segments. Each of the networks transmits data streams according to a predefined network format. In accordance with the invention, the system converts a data stream having the predefined network format to an encoded data stream having a different format for transmission across a network link from one network to another network located a remote site. At the remote site, the encoded data stream is converted back to its original format without loss of data or synchronization. In one embodiment of the invention, the system permits a plurality of network segments to be extended, over a single link, to a remote site. This is accomplished by separating the input data stream associated with each network segment into blocks of N symbols, encoding the block of N symbols and transmitting the encoded blocks across the link in multiplexed fashion.

In one embodiment, a system is disclosed for transforming three state data to two state data. The three state data contains a succession of sequences of idle symbols and sequences of binary data symbols. For any given system each succession of idle signals is defined to have a minimum length of $N_I$ symbols and each succession of data signals is defined to have a minimum length of $N_D$ symbols. The resulting two state data contains a succession of binary data symbols.

The system includes means for separating the sequences of three state data symbols into input blocks of N successive symbols, where N is less than both $N_I+2$ and $N_D+2$. The system also includes means for converting each of the input blocks into an encoded block of N+1 binary values. When the last symbol in the previous input block is an idle symbol the system is in the idle state and each encoded block created includes n symbols having a first binary value where n equals the number of idle symbols in the input block, at least one separator symbol having a second binary value, and N-n data symbols, where the N-n data symbols correspond in accordance with a first predetermined relationship to the binary values of the N-n data symbols in the input block. When the last symbol in the previous input block is a data symbol the system is in the active state and each encode block created includes n symbols having a first binary value, where n equals the number of idle symbols in said input block, at least one separator symbol having a second predetermined value, and N-n data symbols, where the N-n data symbols correspond in accordance with a second predetermined relationship to the binary values of the N-n data symbols in said input block.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE PREFERRED EMBODIMENTS

The invention relates to a method of efficiently encoding a data stream comprising symbols, having three possible states, into binary data or data symbols, having two possible states. One way to encode the data is to separate the data stream into blocks of N symbols and encode them into blocks of K binary symbols. The value of K for a given value of N is the smallest integer that satisfies the inequality $2^K > 3^N$. The efficiency of the encoding is ratio of the output block size to the input block size or K/N. If the data stream is completely random and does not contain any packetization, then the theoretical minimum value of K/N is log(3)/log(2) or 1.585. An encoding system using the values N=5 and K=8 provides an efficiency of 1.60 which is very close to this theoretical minimum.

In the preferred embodiment, the data stream is Ethernet data from a network device such as a network hub to be transmitted over a standard communications media (such as twisted-pair or fiber-optic cable). In addition, the hub may contain as many as 8 or more internal Ethernet networks thus permitting data communication bandwidth of 80 Mbps or higher. Because standard encoding (i.e. Manchester Encoding) of Ethernet data is for transmission over a binary channel such as twisted-pair or fiber-optic cable is inefficient, a channel bandwidth of at least 160 Mbps is required to transmit this Ethernet data between these network hubs. The channel bandwidth requirements can be reduced by realizing that Ethernet data consists of actually three (and not 4) symbols, namely the two Data symbols and an idle symbol. Assuming totally random data, embedded in packets of arbitrary length and separated by inter-packet gaps (Idle periods) of arbitrary length, it is possible in theory to transmit Ethernet data over a channel with a throughput of 15.85 Mbps (10 Mbps×log$_2$(3)).

Figure 1:
FIG. 1 is a diagrammatic representation of packetized data showing the data stream and the data envelope.

However, since a data stream is inherently not completely random, then assumptions can be made about the data stream in order to make the encoding more efficient. In accordance with the invention, the data stream traveling across a network segment is composed of data packets having a known minimum packet length and idle periods, between the data packets, which also have a known minimum idle length (i.e., at least a predetermined number of idle symbols). Therefore, the data stream can be considered to have a data envelope defined in terms of two states, either in an idle state or an active state. During idle states, the data stream contains only idle symbols and during active states the data stream can contain only data symbols (any combination of 1 or 0) and no idle symbols. FIG. 1 is a diagrammatic representation of the ASCII character N, showing the data stream and the data envelope DE. The stream is synchronous, thus changes occur at regular clock intervals T. The data rate is 1/T bits per second.

In accordance with the invention, the data stream is separated into input blocks that are processed by an encoder. The encoder takes an input block of N data symbols and encodes each block into an output block having of N+1 data symbols. This can be accomplished by encoding the state of the data stream, either idle or active, into the output block. In the preferred embodiment, the stream is considered to be in an idle state if the last symbol of the block is an idle symbol and the stream is considered to be in an active state if the last symbol of the block is a data symbol.

The invention contemplates selecting a value for N, the input block size, which can not contain more than one transition from idle state to active state or active state to idle state. Therefore, the largest block $N_{max}$ is the integer that is the smaller of the minimum packet length plus one and the minimum idle length plus one. Using this value of $N_{max}$ permits the decoder to determine the transition from idle to active and vice versa. It is desirable to provide a means for periodically synchronizing the state of decoder with the state of the encoder. In the preferred embodiment, this is accomplished by selecting $N_{max}$ as the largest integer that satisfies the conditions $2N_{max} \leq N_D + 1$ and $2N_{max} \leq N_I + 1$ where $N_D$ is the minimum length of the idle sequence and $N_D$ is the minimum length of the data sequence (packet). This guarantees that at least one block will contain all idle symbols to periodically re-synchronize the system. Alternatively, an invalid or unused block configuration can be used to periodically synchronize the decoder with encoder. In one embodiment, the encoder can insert the synchronization block and the decoder can simply discard it. In another embodiment, the synchronization block can be an alternative representation of a valid block of symbols, such as all idle symbols, which are correctly decoded by the decoder.

In the preferred embodiment, the input data stream contains Ethernet packetized binary data that is Manchester encoded. Manchester encoding is a nonreturn to zero format where each symbol has 3 possible states (0, 1 and idle). The output data stream is to be encoded for transmission over a single binary channel, preferably a fiber optic link, and thus each symbol transmitted across the channel can have only two possible states (0 and 1). In the preferred embodiment, the input block size N is 4 symbols and the output block size is 5 symbols. This provides an efficiency of 1.25 which is better than the theoretical "random data" best efficiency of 1.585.

The tables below provide the encoding sequence in accordance with the preferred embodiment of the invention. The idle symbol is represented by I and a data symbol (1 or 0) is represented by the letters A, B, C, and D. The encoder starts the encoding process by assuming that the data stream is in the idle state. The encoder is said to be in the Idle State if the last symbol of the previous input block was an Idle symbol and the encoder is said to be in the Active state if the last symbol of the previous input block was an Data symbol. Table 1 below lists all the possible input block sequences and the resulting encoded block assuming that the encoder is in the idle state.

TABLE 1

| Input Block Sequence | Encoded Block | Combinations | Next State | Comments |
|---|---|---|---|---|
| IIII | 00001 | 1 | Idle | Continued Idle |
| IIID | 0001D | 2 | Active | 1 Data Symbol |
| IICD | 001CD | 4 | Active | 2 Data Symbols |
| IBCD | 01BCD | 8 | Active | 3 Data Symbols |
| ABCD | 1ABCD | 16 | Active | 4 Data Symbols |

Note that there are a total of only 31 possible input combinations and thus an encoding into 5 binary symbols is possible. The particular encoding used is just an example, there are many other encoding schemes that can be used.

Table 2 below lists all the possible input block sequences and the resulting encoded block assuming that the encoder is in the active state.

TABLE 2

| Input Block Sequence | Encoded Block | Combinations | Next State | Comments |
|---|---|---|---|---|
| IIII | 00001 | 1 | Idle | Continued Idle |
| AIII | 0001A | 2 | Idle | 1 Data Symbol then Idle |
| ABII | 001BA | 4 | Idle | 2 Data Symbols then Idle |
| ABCI | 01CBA | 8 | Idle | 3 Data Symbols then Idle |
| ABCD | 1DCBA | 16 | Active | 4 Data Symbols |

As long as there are no errors, the receiver will maintain synchronization (i.e. be in the same state, data or idle) as the transmitter. If transmission errors occur or if the system functions over long periods of time without re-synchronizing, it is possible for synchronization to be lost. However, as long as the size of the block is small enough to guarantee that the at least one block will contain only data symbols or only idle symbols, the receiver and transmitter can always re-synchronize after a block that contains only data symbols or only idle symbols. For example, in Tables 1 and 2 above, if the block is encoded as 1XXXX (XXXX=ABCD or DCBA), then the next state is always the Active State; if the block is encoded as 00001, then the next state is always the Idle State. In the preferred embodiment, the receiver and transmitter are always synchronized after the encoded block contains four data symbols or four idle symbols.

Alternatively, the transmitter can send an invalid or unused combination of data symbols as synchronization block. Note for example, each encoded block is composed of five binary symbols providing a total of 32 possible input combinations. However, only 31 combinations are used, thus the unused value (00000) can be used as a synchronization block for synchronizing the decoder with the encoder. The synchronization block can transmitted when the encoder changes state and stripped out of the encoded data stream by the decoder.

Table 3 shows the encoding for a typical data stream in accordance with one preferred embodiment of the invention. Table 4 shows an alternative encoding method for a typical data stream in accordance with another preferred embodiment of the invention.

TABLE 3

Data Stream: IIIIABCDEFGHABCDEFGH ... ABCDEFGHIIII

| Input Block | | | | | Encoded Block | | | | | |
|---|---|---|---|---|---|---|---|---|---|---|
| I | I | I | I | 0 | 0 | 0 | 0 | 1 | | Idle Encoding - |
| I | I | I | A | 0 | 0 | 0 | 1 | A | | Idle State |
| I | I | A | B | 0 | 0 | 1 | A | B | | |
| I | A | B | C | 0 | 1 | A | B | C | | |
| A | B | C | D | 1 | A | B | C | D | | |
| E | F | G | H | 1 | H | G | F | E | | Data Encoding - |
| A | B | C | D | 1 | D | C | B | A | | Active State |
| E | F | G | H | 1 | H | G | F | E | | |
| ... | | | | | | | | | | |
| A | B | C | D | 1 | D | C | B | A | | |
| E | F | G | H | 1 | H | G | F | E | | |
| F | G | H | I | 0 | 1 | H | G | F | | |
| G | H | I | I | 0 | 0 | 1 | H | G | | |
| H | I | I | I | 0 | 0 | 0 | 1 | H | | |
| I | I | I | I | 0 | 0 | 0 | 0 | 1 | | |
| $B_3$ | $B_2$ | $B_1$ | $B_0$ | $EB_4$ | $EB_3$ | $EB_2$ | $EB_1$ | $EB_0$ | | |
| 3 State Symbols | | | | | 2 State Symbols | | | | | |

TABLE 4

Data Stream: IIIIABCDEFGHABCDEFGH ... ABCDEFGHIIII

| Input Block | | | | | Encoded Block | | | | | |
|---|---|---|---|---|---|---|---|---|---|---|
| I | I | I | I | 0 | 0 | 0 | 0 | 1 | | Data Enoding - |
| I | I | I | A | 0 | 0 | 0 | 1 | A | | Active State |
| I | I | A | B | 0 | 0 | 1 | A | B | | |
| A | B | C | D | 1 | A | B | C | D | | |
| E | F | G | H | 1 | E | F | G | H | | |
| A | B | C | D | 1 | A | B | C | D | | |
| E | F | G | H | 1 | E | F | G | H | | |
| A | B | C | D | 1 | A | B | C | D | | |
| E | F | G | H | 1 | E | F | G | H | | |
| ... | | | | | | | | | | |
| F | G | H | I | 0 | 1 | G | H | F | | Idle Encoding - |
| G | H | I | I | 0 | 0 | 1 | G | H | | Idle State |
| H | I | I | I | 0 | 0 | 0 | 1 | H | | |
| I | I | I | I | 0 | 0 | 0 | 0 | 1 | | |
| $B_3$ | $B_2$ | $B_1$ | $B_0$ | $EB_4$ | $EB_3$ | $EB_2$ | $EB_1$ | $EB_0$ | | |
| 3 State Symbols | | | | | 2 State Symbols | | | | | |

Figure 2:
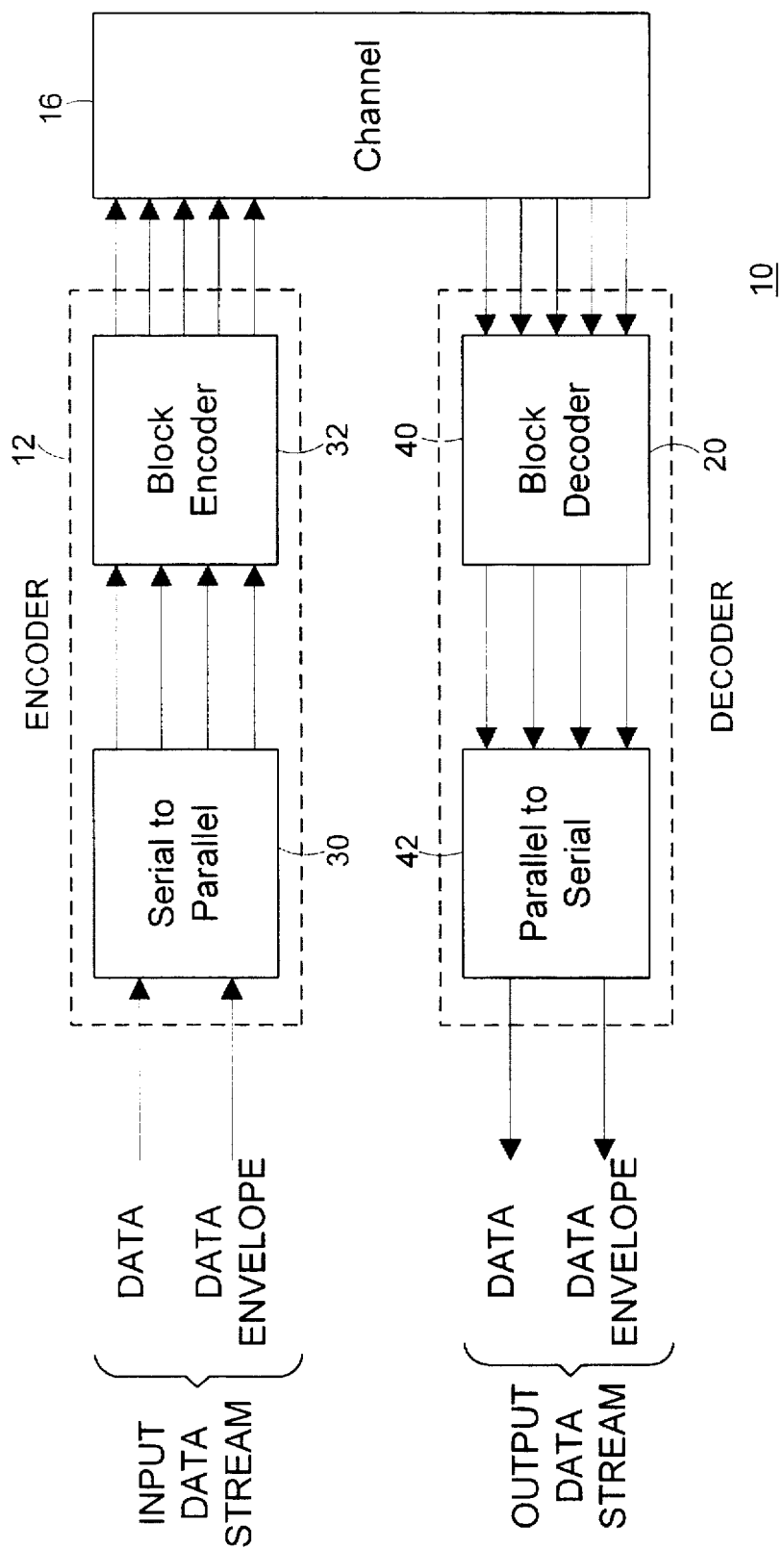
FIG. 2 is a block diagram of an encoding and decoding system in accordance with the invention.

FIG. 2 shows a block diagram of a system 10 in accordance with the invention. The system includes an encoder 12, a communication channel 16 and a decoder 20. One object of the system 10 is to reproduce the input data stream as accurately as possible, at the output. Thus, the input data stream should closely resemble the output data stream, both in data content and data rate. The input data stream consists of a serial stream of data symbols having a data envelope and data. The encoder 12 includes a serial to parallel converter 30 and a black encoder 32. The converter 30 separates the input data stream in to blocks of four data symbols. The serial to parallel converter 30 would not be necessary if the input data stream was already separated into blocks such as bytes or nibbles.

The block encoder 32 encodes an applied succession of input blocks of four data symbols into a corresponding succession of encoded blocks of five binary data symbols according to Tables 1 and 2 above. The encoded blocks are transmitted via the communication channel 16 to the decoder 20. The communication channel 16 can include a transmitter or other hardware necessary, including repeaters, to transmit the encoded blocks across the communication channel and a receiver or other necessary hardware to receive the encoded block at the remote end. The decoder 20 includes a block decoder 40 coupled to the channel 16, and a parallel to serial converter 42 coupled to the output of decoder 40. The decoder 20 receives a succession of encoded blocks of five binary data symbols from the channel 16 and decodes each block into an output block of four data symbols, identical to the corresponding input block. A parallel to serial converter converts the succession output blocks from decoder 40 into an output data stream that resembles the input data stream.

In accordance with the invention, the communication channel 16 can form a part of a network backbone having a plurality of switched hubs connected thereto. Each of the switched hubs can include an encoder and decoder in accordance with the invention to permit the network backbone to extend many separate network segments. Alternatively, encoder and decoder can form part of a stand alone system that permits several network segments to be extended to a remote site without joining the segments.

Figure 3:
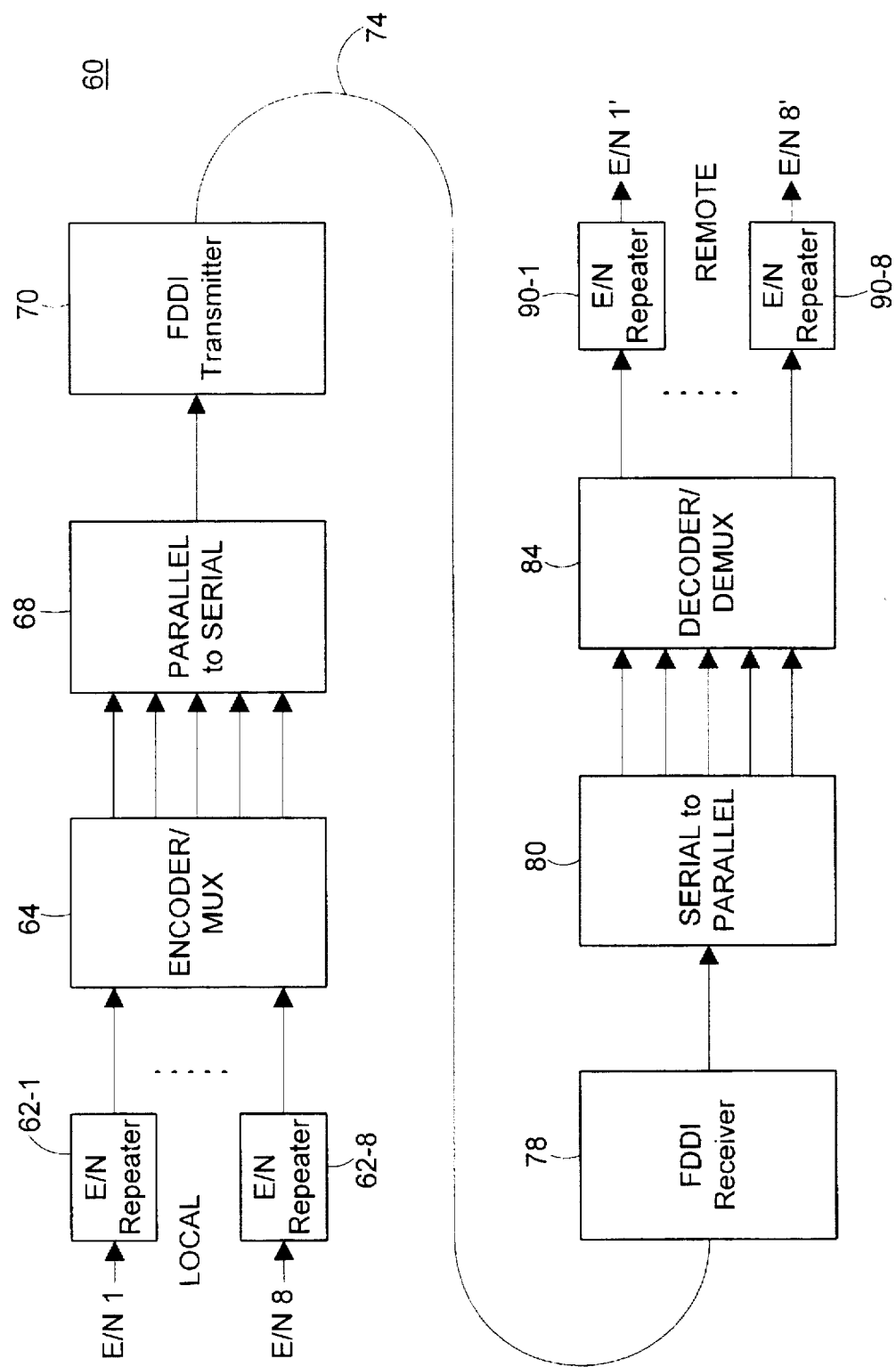
FIG. 3 is a block diagram of a system for extending multiple isolated LAN segments utilizing the encoding and decoding system in accordance with the invention.

FIG. 3 shows a system 60 according to a preferred embodiment of the invention. The system permits the signals from up to eight Ethernet LAN segments (E/N1 to E/N8) to be extended across a single non-Ethernet medium. Each LAN segment is connected to an E/N repeater (62-1 to 62-8) which is connected to an encoder/multiplexer 64. The set of E/N repeaters provides a hardware level interface between the Ethernet medium and the encoder/multiplexer 64 to feed the data stream to the encoder/multiplexer.

The encoder/multiplexer 64 includes eight encoders and a multiplexer in accordance with the invention. The encoders each are substantially the same as the encoder 12 described above in conjunction with FIG. 2. Each encoder separates its input data stream (from its associated repeater) into blocks containing 4 packetized binary nonreturn to zero (NRZ) data symbols and encodes them into encoded blocks of 5 binary data symbols. The multiplexer of element 64 controls the transmission of the encoded blocks from each of the encoders to a parallel to serial converter 68. In the preferred embodiment, the multiplexer of element 64 provides a succession of super blocks which comprise the combination of the encoded blocks of predefined pairs of Ethernet LAN segments. The super blocks each form a block composed of ten binary data symbols. The parallel to serial converter 68 converts the succession of encoded blocks of ten binary data symbols is the super blocks, into a serial data stream. The serial data stream is connected an FDDI transmitter 70 which converts the serial data stream for transmission over a fiber optic medium 74. At the remote end of the system 60, an FDDI receiver 78 converts the signal received from the fiber optic medium 74 to a serial data stream, and a serial to parallel converter 80 converts that serial data stream into encoded blocks of binary symbols. A decoder/demultiplexer 84 separates and decodes the encoded blocks for each Ethernet LAN segment. The decoder/demultiplexer 84 provides a separate output corresponding to each input LAN segment. Those respective outputs are connected by way of a respective one of E/N repeaters 90-1 to 90-8 to provide signals (E/N1') and (E/N8') to associated remote LAN segments.

The system shown in FIG. 3 has been simplified for illustration purposes to show data transmission in one direction. The system for transmitting in the opposite direction is identical. In the preferred embodiment, the system is full duplex which means that it provides bidirectional data transfer over a single fiber optic link. In addition, the FDDI transmitter and receiver are incorporated into a single, bidirectional unit called an FDDI transceiver and the E/N repeaters are also bidirectional.

As stated above, it will be necessary for the system to periodically re-synchronize the state of the receiver with the state of the transmitter. In this embodiment, where the super blocks, preferably composed of 40 symbols (five symbols per block per channel at 8 channels) are transmitted, it may also be necessary to re-synchronize the receiver and transmitter with respect to the boundaries of the super blocks. In the preferred embodiment, the super block synchronization is accomplished using the unused block (00000) as the super block synchronization marker to mark the beginning of the super block. In this embodiment, each of the channels is synchronized on the transition from data to idle upon receipt of 00001 encoded block and the super block is synchronized when the first channel is synchronized by substituting the super block synchronization marker (00000) for the channel synchronization block (00001) in the first encoded block of the super block. Thus the super block is re-synchronized every time the first channel is re-synchronized.

One having ordinary skill in the art will appreciate that the functions of the encoder/multiplexer and/or the decoder/demultiplexer can be performed by separate components of the system. Alternatively, a single encoder or decoder can be multiplexed between each of the LAN segments. In the preferred embodiment, fiber optic media is used to extend the separate LAN segments, however any suitable data transmission media can be substituted for the fiber optic media.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A system for transforming three state data to two state data, said three state data containing a succession of sequences of idle symbols and sequences of binary data symbols, where the said succession of idle signals has a minimum length of $N_I$ symbols and said succession of data signals has a minimum length of $N_D$ symbols, and said two state data containing a succession of binary data symbols, said system comprising:

A. means for separating said three state data into input blocks of N successive symbols from said three state data, where N is less than both $N_I+2$ and $N_D+2$;

B. means for converting each of said input blocks to an encoded block of N+1 binary values each of said encoded block including:
     i. when the last symbol in the next previous input block is an idle symbol:
       a. n symbols having a first binary value, where n equals the number of idle symbols in said input block,
       b. one separator symbol having a second binary value, and
       c. N-n symbols, said N-n symbols corresponding in accordance with a first predetermined relationship to the binary values of the N-n data symbols in said input block, and
     ii. when the last symbol in the previous input block is a data symbol:
       a. n symbols having said first binary value, where n equals the number of idle symbols in said input block,
       b. one separator symbol having said second binary value, and c. N-n symbols, said N-n symbols corresponding in accordance with a second predetermined relationship to the binary values of the N-n data symbols in said input block.

2. The system according to claim 1 wherein in accordance with said first and said second predetermined relationships, each of said N-n symbols corresponds directly to a correspondingly positioned data symbol in said input block.

3. The system according to claim 1 wherein in accordance with said first predetermined relationship, each of said N-n symbols corresponds directly to a corresponding sequentially positioned data symbol in said input block, and wherein in accordance with said second predetermined relationship, each of said N-n symbols corresponds to an inverse sequentially positioned data symbol in said input block.

4. The system according to claim 1 wherein in accordance with said first predetermined relationship, each of said N-n symbols corresponds directly to an inverse, sequentially positioned data symbol in said input block, and wherein in accordance with said second predetermined relationship, each of said N-n symbols corresponds to a corresponding sequentially positioned data symbol in said input block.

5. The system according to claim 1 wherein said data consists of a sequence of at least x contiguous idle symbols and a sequence of at least y contiguous data symbols and wherein said block of N symbols contains fewer than x+2 symbols and fewer than y+2 symbols.

6. The system according to claim 5 wherein said block of N symbols contains the smaller of x+1 symbols and y+1 symbols.

7. The system according to claim 5 wherein said block of N symbols contains the smaller of x/2 symbols and y+2 symbols.

8. The system according to claim 1 wherein said data consists of a sequence of at least 48 contiguous idle symbols and a sequence of at least 64 contiguous data symbols and wherein said block of N symbols contains four symbols.

9. A system for transforming a succession of N+1 symbol blocks of two state data to a corresponding succession of N symbol blocks of three state data, wherein each block of two state data includes:

A. n symbols having a first binary value, where n equals the number of idle symbols to be in said corresponding block of two state data.

B. a separator symbol having a second binary value, and

C. N-n symbols corresponding to binary values of data symbols to be in said corresponding block of two state data, and wherein each block of said three state data contains a sequence of i idle symbols and a sequence of j binary value data symbols, where $0 \leq i \leq N$, $0 \leq j \leq N$ and $i+j=N$, said system comprising:

means operative in succession for each block of said two state data to generate an output signal in the form of an output three state block having n idle symbols and N-n binary data symbols, whereby said succession of three state output blocks form said three state data, having successions of idle symbols having minimum length less than $N_I$ and having successions of data symbols having minimum length less than $N_D$, wherein $N_I$ and $N_D$ are both less than N.

10. A system for encoding nonreturn to zero (NRZ) data containing a sequence of idle symbols and data symbols, comprising:

A. means for separating said data into blocks of N symbols;

B. means for classifying each of said blocks as either an idle block or data block, an idle block comprising a sequence beginning with at least one idle symbol and including a sequence of up to N-1 data symbols, a data block comprising a sequence beginning with at least one data symbol and including a sequence of up to N-1 idle symbols, C. means for converting each idle block to an encoded idle block of N+1 binary values, said encoded idle block including:

i. a sequence of x binary idle symbol values, where x corresponds to the number of idle symbols in said idle block, ii. a separator symbol, and iii. a sequence of binary data values, each binary data value corresponding in the same order to an equivalent binary value for each of said sequential data symbols;

D. means for converting each data block to an encoded data block of N+1 binary values, said encoded data block including:

i. a sequence of x binary idle symbol values, where x corresponds to the number of idle symbols in said data block, ii. a separator symbol, and iii. a sequence of binary data values, each binary data value corresponding in reverse order to an equivalent binary value for each of said sequential data symbol.

11. A system according to claim 10 wherein said data consists of a sequence of at least x contiguous idle symbols and a sequence of at least y contiguous data symbols and wherein said block of N symbols contains fewer than x+2 symbols and fewer than y+2 symbols.

12. A system according to claim 11 wherein said block of N symbols contains the smaller of x+1 symbols and y+1 symbols.

13. A system according to claim 11 wherein said block of N symbols contains the smaller of x/2 symbols and y+1 symbols.

14. A system according to claim 10 wherein said data consists of a sequence of at least 48 contiguous idle symbols and a sequence of at least 64 contiguous data symbols and wherein said block of n symbols contains four symbols.

15. A system for decoding binary data containing a sequence of idle symbols values, a separator symbol and binary data values, comprising:

A. means for separating for said data into blocks of N binary data units;

B. means for converting each of said blocks to an decoded block of N-1 three state data symbols, said decoded block including i. a sequence of x idle symbols, where x corresponds to the number of idle symbol values in said block, and ii. a sequence of data symbols, each data symbol corresponding to an equivalent value for each of said sequential binary data values.

16. A method of encoding nonreturn to zero (NRZ)/(3 state) data containing a sequence of idle symbols and data symbols, comprising the steps of:

A. separating said data into blocks of N symbols;

B. converting each of said blocks to an encoded block of N+1 binary values, said encoded block including i. a sequence of x binary idle symbol values, where x corresponds to the quantity of idle symbols in said block, ii. a separator symbol, and iii. a sequence of binary data values, each binary data value corresponding to an equivalent binary value for each of said sequential data symbols.

17. A method according to claim 16 wherein said data consists of a sequence of at least x contiguous idle symbols and a sequence of at least y contiguous data symbols and wherein said block of n symbols contains fewer than x+2 idle symbols and fewer than y+2 data symbols.

18. A method according to claim 17 wherein said block of N symbols contains the smaller of x+1 symbols and y+1 symbols.

19. A method according to claim 17 wherein said block of N symbols contains the smaller of x/2 symbols and y+1 symbols.

20. A method according to claim 16 wherein said data consists of a sequence of at least 48 contiguous idle symbols and a sequence of at least 64 contiguous data symbols and wherein said block of n symbols contains four symbols.

21. A method according to claim 16, wherein each of said binary idle symbol values is the binary value zero (0).

22. A method according to claim 16 wherein said separator symbol is the binary value one (1).

23. A method according to claim 16 wherein each of said binary idle symbol values is the binary value one (1).

24. A method according to claim 16 wherein said separator symbol is the binary value zero (0).

* * * * *